(12) United States Patent
Nikaidou et al.

(10) Patent No.: US 6,602,643 B2
(45) Date of Patent: Aug. 5, 2003

(54) ULTRAVIOLET-CURABLE RESIN COMPOSITION

(75) Inventors: Masaru Nikaidou, Fukaya (JP); Sachiko Hirahara, Fukaya (JP); Nariaki Kurabayashi, Ohsato-gun (JP)

(73) Assignee: Taiyo Ink Manufacturing Co., Ltd. (JP)

( * ) Notice: Subject to any disclaimer, the term of this patent is extended or adjusted under 35 U.S.C. 154(b) by 0 days.

(21) Appl. No.: 10/102,917

(22) Filed: Mar. 22, 2002

(65) Prior Publication Data

US 2002/0146629 A1 Oct. 10, 2002

Related U.S. Application Data (63) Continuation of application No. PCT/JP00/06510, filed on Sep. 22, 2000, now abandoned.

(30) Foreign Application Priority Data

Sep. 24, 1999 (JP) ............................................ 11-270358

(51) Int. Cl.$^7$ ........................... H01J 29/07; C09D 4/02; G03F 7/028
(52) U.S. Cl. .......................... 430/24; 313/402; 522/182
(58) Field of Search ........................... 430/24; 313/402; 522/182

(56) References Cited

FOREIGN PATENT DOCUMENTS

| EP | 0 930 540 | 7/1999 |
|----|-----------|--------|
| JP | 7-76663 | 3/1995 |
| JP | 10-306124 | 11/1998 |
| JP | 10-307390 | 11/1998 |
| JP | 10-307408 | 11/1998 |
| JP | 11-92964 | 4/1999 |

*Primary Examiner*—John A. McPherson
(74) *Attorney, Agent, or Firm*—Rader, Fishman & Grauer, PLLC; Ronald P. Kananen, Esq.

(57) ABSTRACT

An ultraviolet-curable resin composition comprising a phosphorus atom-containing photopolymerizable compound and a carboxyl group-containing photopolymerizable compound and exhibiting surface tension at 25° C. in the range of 30 to 50 mN/m. Preferably the composition comprises (a) a compound having one or more (meth)acryloyl groups in its molecule and a phosphorus atom, (b) a compound having at least one carboxyl group and one (meth)acryloyl group in its molecule, (c) a compound having one or more (meth)acryloyl groups in its molecule, (d) a leveling agent, and (e) a photoinitiator. The ultraviolet-curable resin composition is useful as a protective material for etching, particularly as a back-coating material in the production of a shadow mask.

9 Claims, 3 Drawing Sheets

ULTRAVIOLET-CURABLE RESIN COMPOSITION

CROSS-REFERENCE TO RELATED APPLICATIONS

This is a continuation of Application PCT/JP00/06510, filed Sep. 22, 2000, now abandoned.

BACKGROUND OF THE INVENTION

1. Field of the Invention

This invention relates to an ultraviolet-curable resin composition, and more particularly to an ultraviolet-curable resin composition which can be suitably used for the formation of a back coat layer in the two-step etching process to be used for the production of shadow masks for high fine color picture tubes. Further, the present invention relates to a method for the production of a shadow mask which uses such a composition in the formation of a back coat layer and to a shadow mask obtained therefrom.

2. Description of the Prior Art

A shadow mask having the function to collide a predetermined coloring object with electrons irradiated from an electron gun in a cathode-ray tube for a color television is a metal plate which includes a great number of minute holes prepared by etching. The formation of the minute holes is performed by preparing plenty of minute concave portions of a hemisphere or square shape having different diameters in the corresponding positions on both the front and back sides of a metal plate respectively and making the bottoms of the corresponding concave portions open for free passage.

The outline of the manufacturing process of a shadow mask is explained hereinbelow. First, a photosensitive resin coating is applied on both the front and back sides of a thin metal plate made of iron, for example. Then, a negative film having a predetermined exposure pattern is superposed on the metal plate, and the photosensitive resin coating film is subjected to exposure to light to cure the exposed areas of the photosensitive resin coating film, to a development treatment to remove the unexposed areas of the photosensitive resin coating film, and to baking thereof. Subsequently, the photosensitive resin coating film is subjected to the primary etching with a corrosive liquid such as ferric chloride to form minute concave portions on one side or on both the front and back sides so as not to be opened. Then, an ultraviolet-curable resin composition as a back-coating material is applied only on one side of the metal plate to form a film which buries the minute concave portions in one side of the metal plate and then cured by subjecting to heating and/or to irradiation of ultraviolet light, etc. After the one side of the metal plate is protected as mentioned above, the concave portions in the other side are again subjected to the secondary etching with a corrosive liquid so as to be opened for free passage in the bottom with the concave portions formed in the one side by the primary etching. Subsequently, each of the cured coating films of the photosensitive resin for pattern formation and the ultraviolet-curable resin composition as the back-coating material are removed by an alkali treatment to obtain a shadow mask.

As a composition which satisfies the performance required of the ultraviolet-curable resin composition as a back-coating material of a shadow mask, the composition obtained by dissolving in water or in an organic solvent an ultraviolet-curable resin capable of forming a film soluble in an alkaline solution is used now. This composition is applied to a substrate which has undergone the primary etching by a rolling method, a spray method and others, then transferred into a hot air drying furnace etc. to evaporate a solvent, and thereafter cured by ultraviolet-light irradiation to form a resin coating film.

The ultraviolet-curable resin composition as a back-coating material obtained by dissolving in a solvent the resin capable of forming a film, however, requires evaporation of a large amount of solvent by heating for the resin film formation. Thus, it needs a heating apparatus and a recovery system of a solvent. Moreover, there is a risk involved in terms of the toxicity accompanying the handling of the organic solvent and the possibility of a flash ignition explosion. In order to decrease any danger such as ignition, explosion, and a fire in a drying step, the use of chlorine-based solvents, which have fire retardant properties, is also under consideration. In recent years, however, these solvents have been regulated in view of problems such as air pollution. Furthermore, a coating film causes volume shrinkage with evaporation of the organic solvent. Consequently, there is a problem in that the coating film of the shoulder part (edge part) of a minute concave portion tends to become thin.

As a method for solving such problems, the method using the ultraviolet-curable resin which is essentially free of solvent may be considered. When the heretofore known alkali-soluble ultraviolet-curable resin of which cured coating film has acid resistance is used in an ultraviolet-curable resin composition as a back-coating material of a shadow mask, however, it is difficult to fill up minute concave portions uniformly with the composition, without producing air bubbles. Moreover, there is the possibility of causing such problems as poor curing properties in a concave bottom portion and the coating residues due to shortage of the alkali solubility and strippability, and poor adhesiveness to a shadow mask material. Accordingly, the composition which satisfies all the required characteristics is not yet known in the art.

Heretofore, it has been thought that such problems as described above originate in the high viscosity of the ultraviolet-curable resin composition to be used. For example, JP 1-261410,A proposes to set the viscosity of a resin composition at 25° C. to 100 cPs or less. However, when the conventionally used ultraviolet-curable resin composition is applied to a material having a finely undulating surface by means of a roll, for example, since the resin composition has low viscosity and tends to flow, the resin composition flows out of a minute concave portion when part of the roll surface part enters into a minute concave portion and pressure is added to the coating therein, which results in shortage of filling up of minute concave portions with the composition. As a result, there is a problem that the coating film of the shoulder part (edge part) of the minute concave portion tends to become thin. Another problem is the occurrence of cissings on the surface of the metal material, i.e. a phenomenon where spot-like portions which are not covered by the coating film due to the surface tension occur. This phenomenon is also referred to as craters. Generally, when the viscosity of the composition is too low, since the cured coating film becomes uneven, it brings such problems as affording poor etching resistance or inferior alkali strippability.

In order to solve such problems, the present inventors have proposed a composition which exhibits surface tension in the range of 30 to 50 mN/m in JP 10-306124,A. The problem in the application of a composition has been solved by this alteration. However, it cannot necessarily be said that the problems of the resistance against an etching process (corrosion resistance) and the peeling of the coating film in the course of conveyance are fully solved. The problem that sufficient resistance has not been acquired is still left behind.

SUMMARY OF THE INVENTION

Accordingly, the fundamental object of the present invention is to provide an ultraviolet-curable resin composition which can be applied uniformly on the finely undulating surface of a material so as to fully fill up even inside of minute concave portions with the composition without producing air bubbles and which can be easily cured by the ultraviolet-light irradiation for a short time, without causing the problems as described above.

A further object of the present invention is to provide a non-solvent type ultraviolet-curable resin composition which is excellent in the coating workability and permits formation of a cured coating film which is excellent in adhesiveness to a metal such as a shadow mask, exhibits high etching resistance, does not exfoliate at the time of conveyance, exhibits solubility and strippability in an alkali treatment after etching, and thus can be advantageously used as a protective material for etching, particularly as a back-coating material in the production of a shadow mask.

Still another object of the present invention is to provide a method for the production of a shadow mask, which method is capable of relatively easily and effectively forming a back coat layer excellent in etching resistance and solubility and strippability in an alkali treatment after etching by bringing the characteristics of the ultraviolet-curable resin composition as mentioned above into play to the maximum extent and forming a great number of perforations with high precision, thereby providing a highly fine and high quality shadow mask.

To accomplish the objects described above, the present invention provides an ultraviolet-curable resin composition characterized by comprising (a) a compound having one or more acryloyl or methacryloyl groups in its molecule and a phosphorus atom, (b) a compound having at least one carboxyl group and one acryloyl or methacryloyl group in its molecule, and (c) a compound having one or more acryloyl or methacryloyl groups in its molecule, wherein the compound (a) mentioned above is incorporated therein in an amount of 0.5 to 10 parts by weight, based on 100 parts by weight of the total amount of the compounds (b) and (c) mentioned above, which exhibits the surface tension at 25° C. in the range of 30 to 50 mN/m.

A more specific mode of the present invention provides an ultraviolet-curable resin composition characterized by further comprising (d) a leveling agent and (e) a photoinitiator besides the components (a) to (c) mentioned above.

The ultraviolet-curable resin composition as mentioned above is excellent in the coating workability and its cured coating film has the characteristics of exhibiting high etching resistance and outstanding solubility and strippability in an alkali treatment after etching. Therefore, this composition can be particularly advantageously used as an ultraviolet-curable resin composition for a back-coating material in the production of a shadow mask.

Accordingly, in accordance with another aspect of the present invention, there is provided a back-coating material to be used for the production of a shadow mask, which material consists of the aforementioned ultraviolet-curable resin composition. Preferably, the back-coating material which exhibits the contact angle of 25° or less to a substrate of a shadow mask is used.

Furthermore, the present invention also provides a method for the production of a shadow mask which uses the aforementioned ultraviolet-curable resin composition in the formation of a back coat layer in the manufacturing process of a shadow mask and a shadow mask obtained therefrom. The method of the present invention is a manufacturing method of a shadow mask comprising at least a step of forming a photosensitive film on both sides of a shadow mask substrate consisting of a strip-like thin metal plate, a step of subjecting both sides having the photosensitive film formed thereon to exposure to light according to a predetermined pattern and to development, thereby exposing part of the metal surface according to the predetermined pattern to form an etching resist, a primary etching step for etching at least one surface of the thin metal plate having this etching resist formed thereon and the partially exposed metal surface, thereby forming concave portions in the exposed part of the metal surface of at least this one surface, a step of forming a back coat layer by applying a back-coating material on one surface having the concave portions formed in the primary etching step and filling up these concave portions with the back-coating material, a secondary etching step for etching a surface opposite to the surface having the back coat layer formed thereon to form concave portions which communicate with the concave portions formed in the primary etching step, and a stripping step for removing the back coat layer and the etching resist, characterized in that the aforementioned back-coating material is used and cured by ultraviolet-light irradiation in the step of forming the back coat layer mentioned above.

DETAILED DESCRIPTION OF THE INVENTION

Since the ultraviolet-curable resin composition of the present invention contains a phosphorus atom-containing photopolymerizable compound and a carboxyl group-containing photopolymerizable compound and exhibits the surface tension at 25° C. within the range of 30 to 50 mN/m, it exhibits good wettability and adhesiveness to the surface of a metal material. Therefore, it can be uniformly applied on the finely undulating material surface so as to successfully fill up the minute concave portions, without producing air bubbles. Furthermore, since the coating film after curing exhibits the outstanding adhesiveness to the metal material surface, it is excellent in the resistance during an etching step and does not exfoliate in a conveyance step etc. Moreover, since the composition contains the carboxyl group-containing photopolymerizable compound, it exhibits good solubility and strippability in an alkali treatment.

The ultraviolet-curable resin composition of the present invention comprising the components (a)-(e) mentioned above contains a compound having one or more acryloyl or methacryloyl groups in its molecule and a phosphorus atom (the above-mentioned component (a)) and two or more of photopolymerizable compounds (the above-mentioned components (b) and (c)). Therefore, the composition has excellent ultraviolet-light curing properties and can be easily cured by ultraviolet-light irradiation for a short time, without producing insufficient curing in the concave bottom portions. Furthermore, the coating film after curing is excellent in the adhesiveness to a metal material and exhibits such characteristics as corrosion resistance to an acid treatment and solubility and strippability in an alkali treatment.

Accordingly, the ultraviolet-curable resin composition of the present invention can be advantageously used as protective materials against various etching treatments, particularly as a back-coating material of a shadow mask.

Since the composition of the present invention even with high viscosity can be applied to a material, it is possible to form a uniform coating film which secures the sufficient thickness of coating in the edge part of the minute concave portion. Consequently, the etching resistance of the cured coating film increases so as to sufficiently cope with the prolonged etching of the shadow mask of the thick board used for a large-sized cathode-ray tube. Furthermore, since the ultraviolet-curable resin composition of the present invention is substantially a non-solvent type composition, it enjoys the advantages of high safety and low stimulus to the skin when dealing with it. Moreover, since there is no need to use the composition as conventionally obtained by dissolving in water or in an organic solvent the resin capable of forming a film which is soluble in an alkaline solution, the drying furnace for evaporating water or an organic solvent and the recovery system of a solvent required by the conventional method are unnecessary. Therefore, the present invention permits improvement in productivity owing to short-time curing, reduction of energy costs in a drying step etc., and a large omission of treating steps and allows simplification of the system. Thus, the present invention's industrial value is very high.

Now, the components which constitute the ultraviolet-curable resin composition of the present invention will be described below. First, the component (a) mentioned above is a compound having one or more acryloyl or methacryloyl groups (hereinafter referred to collectively as "(meth)acryloyl group(s)") in its molecule and a phosphorus atom and contributes to improvement in the adhesive strength of a cured coating film to a shadow mask material and etching resistance. As examples of such a compound (a), the esterified products of alkyl phosphates enumerated below may be cited.

As concrete examples of the ester compound mentioned above, methacryloyloxyethyl phosphate, bis(methacryloyloxyethyl) phosphate, monochloroacetic phosphine (meth)acrylate, monofluoroacetic phosphine (meth)acrylate, propionic phosphine (meth)acrylate, octylic phosphine (meth)acrylate, versatic phosphine (meth)acrylate, palmitic phosphine (meth)acrylate, cresotic phosphine (meth)acrylate, naphthoic phosphine (meth)acrylate, benzoic phosphine (meth)acrylate, trichlorophenoxyacetic phosphine (meth)acrylate, dichlorophenoxyacetic phosphine (meth)acrylate, quinolinecarboxylic phosphine (meth)acrylate, nitrobenzoic phosphine (meth)acrylate, nitronaphthalenecarboxylic phosphine (meth)acrylate, pyruvic phosphine (meth)acrylate, and ethylene oxide adducts and propylene oxide adducts of the above compounds may be cited. These compounds may be used either singly or in the form of a combination of two or more members at an arbitrary ratio. Incidentally, the term "(meth)acrylate" as used in the present specification refers collectively to acrylate and methacrylate.

The preferred amount of the component (a) mentioned above is in the range of 0.5 to 10 parts by weight, more preferably in the range of 1 to 5 parts by weight, based on 100 parts by weight of the total amount of the components (b) and (c) mentioned above (the term "part(s)" mentioned hereinafter refers to "part(s) by weight"). If the amount of the component (a) to be incorporated is less than 0.5 part by weight, the adhesiveness of the resultant cured coating film will decrease and further the etching resistance will also tend to decrease. Conversely, if the amount is larger than 10 parts by weight, the alkali solubility and strippability of the resultant cured coating film will become insufficient.

The component (b) mentioned above is a compound having one carboxyl group and one acryloyl or methacryloyl group in its molecule, for example a monoester compound of a dibasic acid anhydride with a monomer having at least one hydroxyl group and one (meth)acryloyl group in its molecule.

As examples of the dibasic acid anhydride, phthalic anhydride, tetrahydrophthalic anhydride, methyltetrahydrophthalic anhydride, ethyltetrahydrophthalic anhydride, propyltetrahydrophthalic anhydride, butyltetrahydrophthalic anhydride, hexahydrophthalic anhydride, methylhexahydrophthalic anhydride, ethylhexahydrophthalic anhydride, propylhexahydrophthalic anhydride, isopropylhexahydrophthalic anhydride, butylhexahydrophthalic anhydride, maleic anhydride, and succinic anhydride may be cited. As examples of the monomer having at least one hydroxyl group and one (meth)acryloyl group in its molecule, hydroxyethyl (meth)acrylate, hydroxypropyl (meth)acrylate, hydroxybutyl (meth)acrylate, polyethylene glycol mono(meth)acrylate, polypropylene glycol mono(meth)acrylate, polybutylene glycol mono(meth)acrylate, and polycaprolactam mono(meth)acrylate may be cited.

The synthesis of the monoester compound mentioned above is preferably performed by the ring opening addition reaction of the acid anhydride and the monomer. However, it is also possible to carry out the synthesis by a usual esterification reaction. In the synthesis of such a monoester compound, it is preferable to use one mole of the monomer per one mole of the acid anhydride, but it is also possible to use one compound in an excess amount. The reaction temperature of the ring opening addition reaction mentioned above is generally in the range of 500 to 150° C., preferably in the range of 800 to 110° C. The ring opening addition reaction mentioned above may be performed by using a tertiary amine such as triethylamine, morphorine, or triethanolamine, or their quaternary ammonium salts as a promotor. It is also possible to use a polymerization inhibitor such as hydroquinone, butyl hydroquinone, butyl catechol, or phenothiazine for the sake of preventing the reaction from inducing polymerization of the reactants. The progress of the ring opening addition reaction mentioned above can be easily confirmed by the infrared absorption spectrum of the acid anhydride and the disappearance of a peak in the infrared absorption spectrum of the acid anhydride can be assumed to be the completion of the reaction.

As concrete examples of the monoester compound mentioned above, (meth)acryloyloxyethyl monophthalate, (meth)acryloyloxypropyl monophthalate, (meth)acryloyloxybutyl monophthalate, (meth)acryloyloxyethyl monotetrahydrophthalate, (meth)acryloyloxypropyl monotetrahydrophthalate, (meth)acryloyloxybutyl monotetrahydrophthalate, (meth)acryloyloxyethyl monohexahydrophthalate, (meth)acryloyloxypropyl monohexahydrophthalate, (meth)acryloyloxybutyl monohexahydrophthalate, (meth)acryloyloxyethyl monosuccinate, (meth)acryloyloxypropyl monosuccinate, (meth)acryloyloxybutyl succinate, and (meth)acryloyloxyethyl maleate may be cited. These compounds may be used either singly or in the form of a combination of two or more members at an arbitrary ratio.

The preferred amount of the component (b) mentioned above is in the range of 50 to 90 parts by weight, more preferably in the range of 60 to 85 parts by weight, based on 100 parts by weight of the total amount of the components (a) and (c) mentioned above. If the amount of the component (b) to be incorporated is less than 50 parts by weight, the alkali solubility and strippability of the resultant cured coating film will become insufficient. Conversely, if the amount is larger than 90 parts by weight, the excess will produce problems so that the filling properties of the resin composition into minute concave portions and the surface smoothness thereof will tend-to become low due to the increase in viscosity of the resin composition and further that the resultant cured coating film will tend to become brittle.

The component (c) mentioned above is a compound having one or more (meth)acryloyl groups in its molecule and contributes to improvement in the curing properties of a cured coating film. As examples of such a compound (a), the reaction products of a polyfunctional alcohol and (meth) acrylic acid (wherein the term "(meth)acrylic acid" means acrylic acid, methacrylic acid, or a mixture thereof), the reaction products of a polybasic acid or anhydride thereof and (meth)acrylic acid, the reaction products of an epoxy compound having one or more epoxy groups in its molecule and (meth) acrylic acid, and the reaction products of an isocyanate compound having one or more isocyanate groups in its molecule and a hydroyl group-containing (meth)acrylate may be cited. Such a component (c) includes a compound having one (meth)acryloyl group in its molecule and a compound having two or more (meth)acryloyl groups in its molecule as enumerated below. Any compound may be used. Among them, it is preferred to use the compound having two or more (meth)acryloyl groups in its molecule, more preferably one or more of the compounds having two or more (meth)acryloyl groups in its molecule in combination with other compounds, in terms of the UV-curing properties and easiness of the adjustment of viscosity of the resin composition and the properties of the cured coating film.

Of the component (c) mentioned above, the compound having one (meth)acryloyl group in its molecule is useful for the adjustment of the viscosity of the composition and the properties of the cured coating film. As concrete examples of the above compound, alkyl (meth)acrylates such as propyl (meth)acrylate, isopropyl (meth)acrylate, isobutyl (meth)acrylate, and t-butyl (meth)acrylate; hydroxyalkyl (meth)acrylates such as hydroxyethyl (meth)acrylate and hydroxypropyl (meth)acrylate; cyclic (meth)acrylates such as cyclohexyl (meth)acrylate, benzyl (meth)acrylate, benzoyloxyethyl (meth)acrylate, phenoxyethyl (meth)acrylate, phenoxydiethylene glycol (meth)acrylate, hydroxyphenoxypropyl (meth)acrylate, tetrahydrofurfuryl (meth)acrylate, isobornyl (meth)acrylate, and dicyclopentyloxyethyl (meth)acrylate; aminoalkyl (meth)acrylates such as dialkylaminoethyl (meth)acrylate and cyanoethyl (meth)acrylate; ethoxyethyl (meth)acrylate, (meth)acryloxyethyl phosphate, fluoroalkyl (meth)acrylate, sulfopropyl (meth)acrylate, glycidyl (meth)acrylates, urethane (meth)acrylates, diethylene glycol mono(meth)acrylate, triethylene glycol mono(meth) acrylate, polyethylene glycol mono(meth)acrylate, polypropylene glycol mono(meth)acrylate, pentaerythritol mono (meth)acrylate, dipentaerythritol mono(meth)acrylate, dimethylolpropane mono(meth)acrylate, trimethylolpropane mono(meth)acrylate, triglycidyl isocyanurate mono(meth)acrylate, tetraphenylmethane type epoxy mono(meth)acrylate, trisphenylmethane type epoxy mono(meth)acrylate, glycerin diglycidyl ether mono (meth)acrylate, isocyanurate mono (meth)acrylate, melamine mono(meth)acrylate, and other monovalent compounds such as ethylene oxide adducts and propylene oxide adducts of the above compounds may be cited. These compounds may be used either singly or in the form of a combination of two or more members at an arbitrary ratio.

The aforementioned compound having two or more (meth)acryloyl groups in its molecule is useful for the adjustment of the curing properties of the cured coating film. As concrete examples of the above compound, di(meth)acrylates of alkyldiol such as 1,6-hexanediol di(meth)acrylate and 1,9-nonanediol di(meth)acrylate; diethylene glycol di(meth)acrylate, triethylene glycol di(meth)acrylate, polyethylene glycol di(meth)acrylate, polypropylene glycol di(meth)acrylate, pentaerythritol di-, tri- or tetra-(meth) acrylate, dipentaerythritol di-, tri-, tetra-, penta- or hexa-(meth)acrylate, dimethylolpropane di(meth)acrylate, trimethylolpropane di- or tri-(meth)acrylate, phenol novolak type epoxy acrylate such as Lipoxy SP-4010 manufactured by Showa Highpolymer K.K., cresol novolak type epoxy acrylate, bisphenol A type epoxy di(meth)acrylate such as Epoxy Ester 3000A manufactured by Kyoeisha Kagaku K.K., triglycidyl isocyanurate di- or tri-(meth)acrylate, tetraphenylmethane type epoxy di-, tri- or tetra-(meth)acrylate, trisphenylmethane type epoxy di- or tri-(meth)acrylate, glycerin diglycidyl ether di(meth)acrylate, isocyanuric di- or tri-(meth)acrylate, melamine di- or tri-(meth)acrylate, urethane (meth)acrylates, aminoalkyl (meth)acrylates, and other polyvalent compounds such as ethylene oxide adducts and propylene oxide adducts of the above compounds may be cited. These compounds may be used either singly or in the form of a combination of two or more members at an arbitrary ratio.

The preferred amount of the component (c) mentioned above is in the range of 10 to 50 parts by weight, more preferably in the range of 15 to 40 parts by weight, based on 100 parts by weight of the total amount of the components (a) and (b) mentioned above. If the amount of the component (c) to be incorporated is less than 10 parts by weight, the filling properties of the resin composition into minute concave portions and the surface smoothness thereof will tend to become inferior due to the increase in viscosity of the resin composition and further the resultant cured coating film will tend to become brittle and its etching resistance will become low. Conversely, if the amount is larger than 50 parts by weight, the alkali solubility and strippability of the resultant cured coating film will become insufficient. Incidentally, when the compound ingredient having one (meth)acryloyl group in its molecule and the compound ingredient having two or more (meth)acryloyl groups in its molecule mentioned above are used in combination, the amount of the compound ingredient having one (meth)acryloyl group in its molecule may be in the range of 0 to 20 parts by weight, more preferably in the range of 0 to 15 parts by weight, based on 100 parts by weight of the total amount of the components (a) and (b) mentioned above. On the other hand, the amount of the compound ingredient having two or more (meth)acryloyl groups in its molecule may be in the range of 5 to 45 parts by weight, more preferably in the range of 15 to 35 parts by weight. The above disadvantages will be applicable when the amount of these ingredients (c) is larger than or smaller than the ranges mentioned above.

The aforementioned component (d), the leveling agent, is a component for adjusting the filling properties of the composition into minute concave portions, the surface smoothness of the cured coating film, and the anti-foaming properties and surface tension of the composition. Although this object can be fully accomplished by using a usual anti-foaming agent, surface smoothness-imparting agent, wet dispersant, etc., a compound which does not excessively lower the viscosity of the composition is preferable. As examples of such compounds, lower alcohols, organic polar compounds, mineral oils, silicone resins may be cited. As concrete examples of the compounds, polyoxyalkylene derivatives, acrylic copolymers, fatty acid derivatives, and silicone oil may be cited. These compounds may be used either singly or in the form of a combination of two or more members at an arbitrary ratio.

The preferred amount of the component (d) is in the range of 0.05 to 5 parts by weight, more preferably in the range of 0.1 to 2 parts by weight, based on 100 parts by weight of the total amount of the components (a), (b) and (c) mentioned above. If the amount of the component (d) to be incorporated is less than 0.05 part by weight, the problems in the filling properties into minute concave portions, the surface smoothness, and anti-foaming properties of the composition will tend to occur. Conversely, if the amount is larger than 5 parts by weight, such defects as craters, floating, orange peel, fish eyes, etc. will tend to occur due to the decrease in surface tension when the composition is applied to a substrate and problems in the anti-foaming properties of the composition will tend to occur.

As the component (e) mentioned above, photoinitiators, any usual photopolymerization initiators may be used for fully bringing the photocuring properties of the ultraviolet-curable resin composition into play. Although any known photopolymerization initiators may be used in the present invention, photopolymerization initiators which impart excellent thermal stability and storage stability to the composition prepared by incorporation thereof are preferable. As examples of such photopolymerization initiators, benzoin alkyl ethers such as benzoin isopropyl ether; acetophenones such as diethyl acetophenone; propiophenones such as 2-hydroxy-2-methyl-1-phenylpropan-1-one; anthraquinones such as 2-ethylanthraquinone; thioxanthones such as isopropylthioxanthone; and ketals such as benzyl dimethyl ketal may be cited. These photoinitiators may be used either singly or in the form of a combination of two or more members at an arbitrary ratio. The preferred amount of the photoinitiator is in the range of 1 to 10 parts by weight, more preferably in the range of 2 to 8 parts by weight, based on 100 parts by weight of the total amount of the components (a), (b) and (c) mentioned above. If the amount of the photoinitiator to be incorporated is less than 1 part by weight, it will tend to induce insufficient curing of the composition and a decrease in acid resistance. Conversely, if the amount is larger than 10 parts by weight, it will be difficult to increase the polymerization degree at the time of ultraviolet-light irradiation and the acid resistance of the resultant product will also tend to decrease. As the component (e), a photosensitizer may be used in combination with the photopolymerization initiator.

The ultraviolet-curable resin composition of the present invention exhibits the surface tension at 25° C. falling within the range of not less than 30 mN/m and not more than 50 mN/m, as described above. More preferable surface tension is not less than 35 mN/m and not more than 45 mN/m. The surface tension of the ultraviolet-curable resin composition can be easily adjusted by using the components suitably selected from the components (a) through (e) mentioned above. Heretofore, it has been said that the lower viscosity of a composition is proper from the viewpoint of filling properties into minute concave portions, and it has been thought that 100 cPs or less are more desirable. However, unlike such conventional views, it has been confirmed by the prior invention (JP 10-306124,A) that the coating of the ultraviolet-curable resin composition having the viscosity higher than 100 cPs which has been heretofore considered to be difficult to make coating can be easily carried out by adjusting the surface tension of the composition and, even if the composition has the viscosity of 1,000 cPs or more, its coating is possible. As a result of the inventor's study, it has been confirmed that this is also applicable to the composition of the present invention. If the surface tension at 25° C. is less than 30 mN/m, the craters, floating, orangepeel, fisheyes, etc. resulting from the decrease of surface tension will occur in the coating film and the problem with respect to the anti-foaming property, etc. will arise because the foaming of a composition will occur. Therefore, it is difficult to uniformly fill up a great number of minute concave portions of the hemisphere or square shapes having different diameters with the composition without producing air bubbles and to maintain the evenness of the surface of a coating film. Conversely, if the surface tension at 25° C. exceeds 50 mN/m, the wettability of the composition to a material to be applied is inferior because of its high surface tension and also it is difficult to uniformly fill up the minute concave portions and to maintain the evenness of the surface of the coating film. For the same reasons, even when the temperature is increased for the purpose of easily carrying out the coating of the ultraviolet-curable resin composition of high viscosity (for example, to 50° C.), it is desirable that the surface tension should be in the range of not less than 30 mN/m and not more than 50 mN/m.

Particularly in the manufacturing process of a shadow mask, the factor that regulates the filling properties when the minute concave portions are filled up with a back-coating material is a contact angle relating to the aforementioned surface tension. If the ultraviolet-curable resin composition having the contact angle appropriately specified is used as the back-coating material and a coating method which enables this ultraviolet-curable resin composition to contact the side walls of the minute concave portions is used, the filling of the minute concave portions with the composition can be performed easily. That is to say, in the method for the production of the shadow mask according to the present invention, preferably the ultraviolet-curable resin composition, which specifies that the contact angle to a substrate of the shadow mask to be used becomes 25° or less, is used as the back-coating material.

Figure 1:
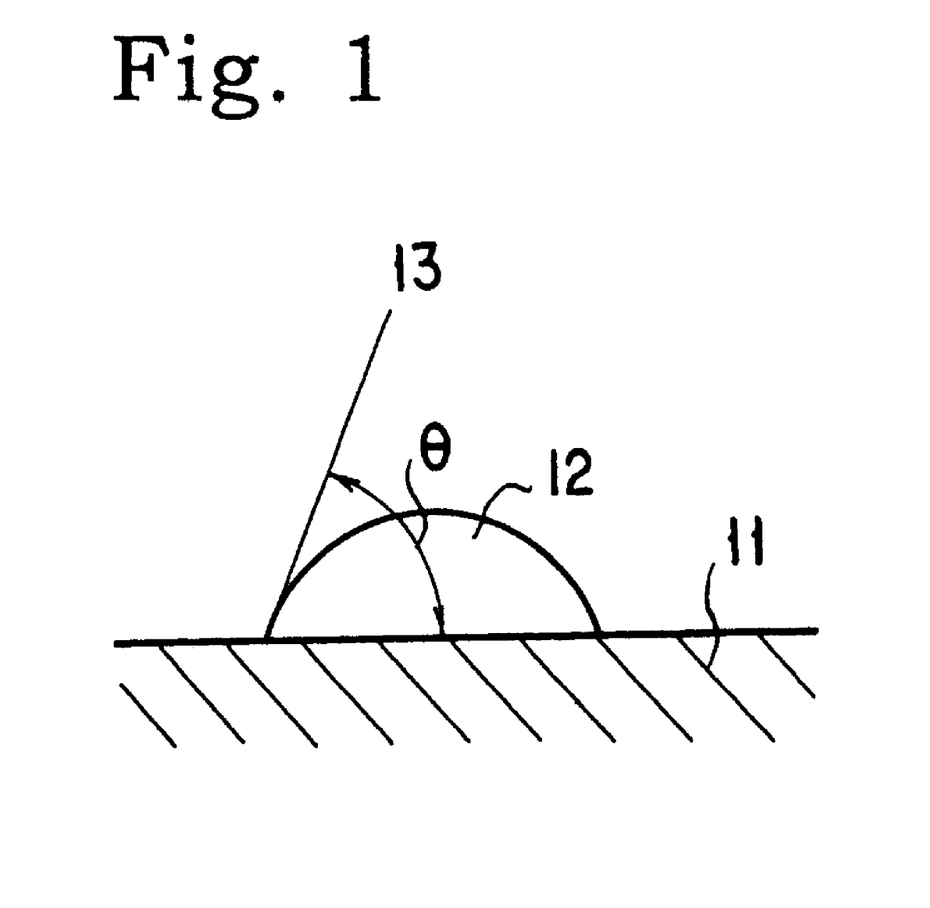
FIG. 1 is a view for explaining the contact angle which specifies the ultraviolet-curable resin composition of the present invention.
Figure 2:
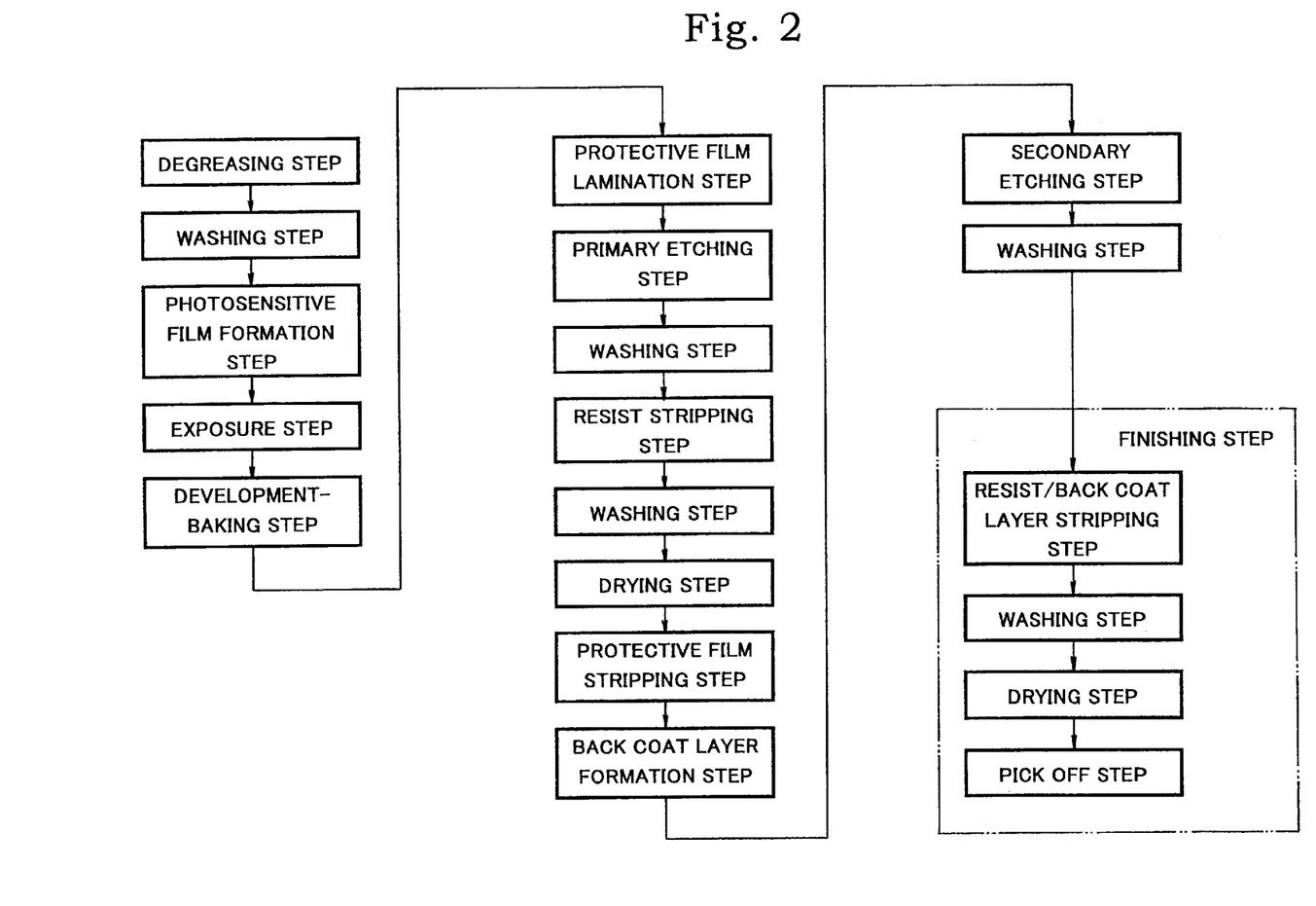
FIG. 2 is a flow chart showing the steps in the method of producing a shadow mask according to the present invention.

The contact angle as used herein is defined as the angle, θ, between the surface of the shadow mask substrate 11 and the tangent line 13 of the hemispherical droplet 12 produced when a droplet of an ultraviolet-curable resin composition is calmly dropped on the shadow mask substrate 11, as shown in FIG. 1. Such a contact angle, θ, can be easily measured by using a contact angle meter such as, for example, the product manufactured by Kyowa Kaimen Kagaku K.K. In an actual manufacturing process of the shadow mask, the surfaces to be applied and filled up with a back-coating material include two surfaces, one being the surface of the minute concave portion subjected to the etching treatment and the other being the surface covered by an etching resist in the primary etching step where the etching resist is stripped with an alkaline solution before applied and filled up with the back-coating material, and the back-coating material is adjusted so that the contact angle may be 25° or less to both of these substrate surfaces. Even when the substrate is applied and filled up with the back-coating material without stripping the etching resist on the small hole side after the primary etching process, the contact angle to the etching resist is also required to be 25° or less.

Since the ultraviolet-curable resin composition of the present invention can be adjusted so that the contact angle thereof may be 25° or less to either of the shadow mask substrate surfaces; the etched surface in minute concave portion, the surface covered by the etching resist in the primary etching step where the etching resist is stripped with an alkaline solution before applied and filled up with the back-coating material, and the etching resist surface which may remain on the small hole side, in the process of back coat layer formation the complete filling of minute concave portions with the back-coating material consisting of the aforementioned ultraviolet-curable resin composition can be performed easily without producing cissings and air bubbles if the coating method which can bring the back-coating material into contact with the inside walls of the concaves forming the minute concave portions is chosen appropriately. If the contact angle is 25° or less, the minute concave portions can be easily filled up with the ultraviolet-curable resin composition having such viscosity of 100 cPs or more where the coating thereof has been conventionally considered to be difficult, provided that the feeding of liquid can be done. For this reason, the coating of the ultraviolet-curable resin composition of the present invention can be performed even at normal temperature, unlike the conventional attempt to heat the composition when coating is carried out to lower the viscosity, and thus simplification of the coating apparatus can be accomplished.

Further, since the ultraviolet-curable resin composition of the present invention can be easily adjusted so that the contact angle thereof to a shadow mask substrate may be 25° or less, there is no need to carry out the (thermal) leveling after the coating. The simplification of the coating apparatus can be made also from this point and the uniform coating of the back coat layer can be easily accomplished.

As a method of applying the ultraviolet-curable resin composition of the present invention, the usual application methods such as a roll coating method, a spray coating method, a flow coating method, and a dip coating method may be used. Incidentally, since the heating of the resin composition to a temperature exceeding room temperature is effective in improving the filling properties thereof into the minute concave portions owing to the decrease of the viscosity, it is therefore a desirable operation when there is no restriction to the apparatus etc. Particularly in the formation of the back coat layer in the manufacture of a shadow mask, it is desirable to use a direct coating method, a gravure coating method, a microgravure coating method, a forced coating method, a doctor nozzle coating method, and the like.

The curing of the ultraviolet-curable resin composition of the present invention can be effected in a usual manner by the ultraviolet-light irradiation with a high-pressure mercury vapor lamp, a metal halide lamp, a xenon lamp and the like.

Next, a preferred embodiment of the method of producing a shadow mask will be described with reference to FIG. 2 and FIGS. 3A through 3G. FIG. 2 and FIGS. 3A through 3G illustrate the flow of the manufacturing process of the shadow mask and change in the cross-sectional profile of a thin metal plate.

Figure 3A:
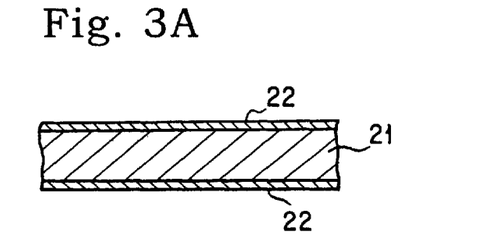
FIG. 3A through FIG. 3G are fragmentary sectional views illustrating change in the cross-sectional profile of a thin metal plate in each step of the method of producing the shadow mask according to the present invention.

First, the thin metal plate 21 as a substrate is degreased by using an alkaline solution for the purpose of degreasing oil such as rolling oil and rustproof oil, washed, and then rinsed with water. Thereafter, as shown in FIG. 3A, a photosensitive material, for example the photosensitive material consisting of casein and ammonium bichromate, is applied on both sides of the thin metal plate 21 by a dipping method to a predetermined thickness and dried to form photosensitive films 22 each having a thickness of several micrometers.
(Photosensitive Film Formation Step).

Figure 3B:
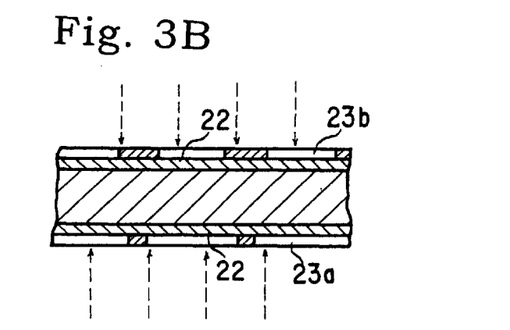

Next, as shown in FIG. 3B, a pair of photomasks comprising a photomask 23a having the pattern formed so as to correspond to small holes of perforations of the shadow mask on the electron gun side and a photomask 23b having the pattern formed so as to correspond to large holes of perforations of the shadow mask on the fluorescent screen side are superposed on the photosensitive films 22 formed on both sides of the plate, respectively, and the photosensitive films 22 are cured by exposure to ultraviolet light according to the pattern of these photomasks 23a and 23b.
(Exposure Step).

Figure 3C:
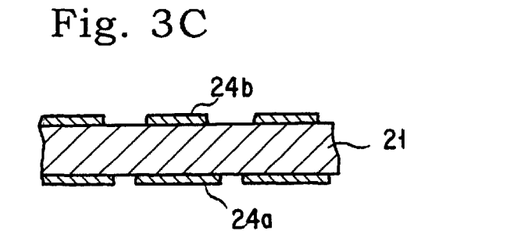

Then, the photosensitive films 22 of both sides cured according to the predetermined pattern are developed with a developing solution such as water to remove the unexposed areas. Then, the photosensitive films 22 are subjected to drying and baking for hard-film formation to form etching resist patterns 24a and 24b each having a pattern corresponding to the pattern of the aforementioned pair of photomasks 23a and 23b respectively, as shown in FIG. 3C.
(Development-Baking Step).

Figure 3D:
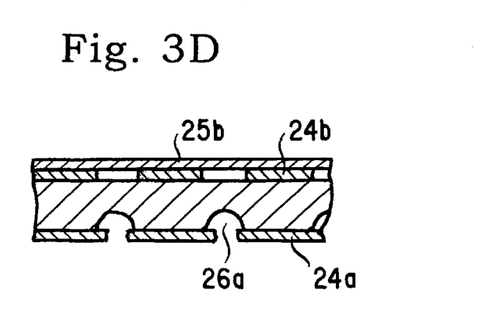

Thereafter, a protective film 25b, obtained by applying an adhesive agent to a resin film, is laminated on the surface having the etching resist pattern 24b formed thereon so as to correspond to the large holes of perforations of the shadow mask on the fluorescent screen side, as shown in FIG. 3D, and the surface having the etching resist pattern 24a formed thereon so as to correspond to the small holes of the perforations of the shadow mask on the electron gun side is subjected to the spray etching with an etching liquid such as a ferric chloride solution and rinsed with water, thereby forming small concave portions 26a of the electron gun side of the shadow mask in the surface in which this etching resist pattern 24a has been formed.
(Primary Etching Step).

Figure 3E:
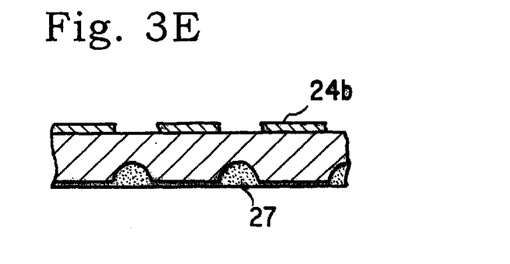

Next, the etching resist pattern 24a on the small hole side which has undergone the etching is stripped with an alkaline solution and rinsed with water, and the protective film 25b laminated on the etching resist pattern 24b is removed. The back-coating material consisting of the ultraviolet-curable resin composition as mentioned above is applied to fill up the small concave portions 26a and cured by exposure to light to form a back coat layer 27, as shown in FIG. 3E.
(Back Coat Layer Formation Step).

Figure 3F:
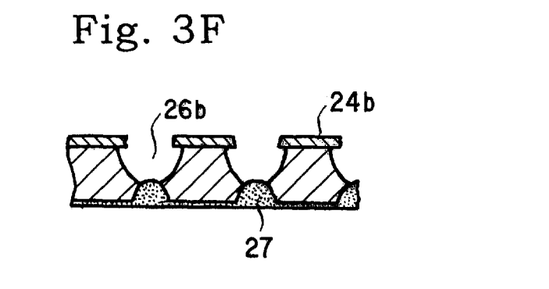

Then, as shown in FIG. 3F, the surface in which the etching resist pattern 24b has been formed is etched by using an etching liquid such as a ferric chloride solution and rinsed with water, thereby forming large concave portions 26b of the fluorescent screen side of the shadow mask in the surface in which the etching resist pattern 24b has been formed.
(Secondary Etching Step).

Figure 3G:
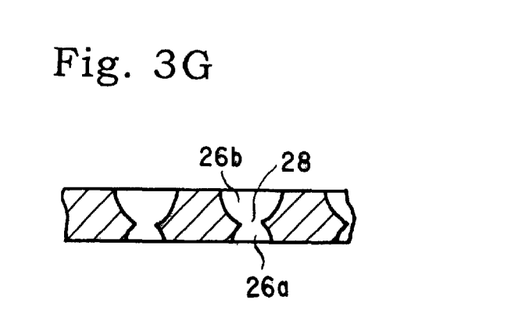

Finally, the etching resist pattern 24b on the surface side in which large concave portions 26b have been formed and the back coat layer 27 on the surface side in which small concave portions 26a have been formed are stripped and removed with an alkaline solution, thereby forming through-holes 28 consisting of the small concave portions 26a and the large concave portions 26b intercommunicated to each other, as shown in FIG. 3G.
(Finishing Step).

By the two-step etching method described above, a highly minute and high quality shadow mask is formed.

Now, the present invention will be described specifically below by reference to working examples and comparative examples. As a matter of course, the present invention is not limited to the following examples.

EXAMPLE 1

An ultraviolet-curable resin composition was obtained by mixing and dissolving 5 parts of benzyl dimethyl ketal as the component (e) into a composition prepared by mixing 2 parts of bis(methacryloyloxyethyl) phosphate as the component (a), 100 parts of acryloyloxyethyl monophthalate as the component (b), 20 parts of diethylene glycol dimethacrylate as the component (c), and 0.2 part of butadiene copolymer (manufactured by BYK Chemie Japan K.K., BYK-055) as the component (d) while heating to 60° C.

EXAMPLE 2

An ultraviolet-curable resin composition was obtained by following the procedure of Example 1, except that 2 parts of bis(methacryloyloxyethyl) phosphate as the component (a), 100 parts of acryloyloxypropyl monotetrahydrophthalate as the component (b), and 20 parts of 1,9-nonanediol diacrylate as the component (c) were compounded.

EXAMPLE 3

An ultraviolet-curable resin composition was obtained by following the procedure of Example 1, except that 2 parts of bis(methacryloyloxyethyl) phosphate as the component (a), 100-parts of acryloyloxyethyl monohexahydrophthalate as the component (b), and 20 parts of triethylene glycol diacrylate as the component (c) were compounded.

EXAMPLE 4

An ultraviolet-curable resin composition was obtained by following the procedure of Example 1, except that 2 parts of bis(methacryloyloxyethyl) phosphate as the component (a), 100 parts of acryloyloxyethyl monosuccinate as the component (b), and 20 parts of ethylene oxide adduct of trimethylolpropane triacrylate (manufactured by Kyoeisha Kagaku K. K., Light Acrylate TMP-3EO-A) as the component (c) were compounded.

EXAMPLE 5

An ultraviolet-curable resin composition was obtained by following the procedure of Example 1, except that 2 parts of bis(methacryloyloxyethyl) phosphate as the component (a), 100 parts of acryloyloxyethyl monophthalate as the component (b), and 20 parts of polyethylene glycol diacrylate (acrylate of PEG#200) as the component (c) were compounded.

EXAMPLE 6

An ultraviolet-curable resin composition was obtained by following the procedure of Example 1, except that 2 parts of methacryloyloxyethyl phosphate as the component (a), 100 parts of acryloyloxyethyl monophthalate as the component (b), 15 parts of 2-hydroxyethyl methacrylate as the component (c-1), and 15 parts of ethylene oxide adduct of trimethylolpropane triacrylate (manufactured by Kyoeisha Kagaku K.K., Light Acrylate TMP-3EO-A) as the component (c-2) were compounded.

EXAMPLE 7

An ultraviolet-curable resin composition was obtained by following the procedure of Example 1, except that 2 parts of methacryloyloxyethyl phosphate as the component (a), 100 parts of acryloyloxyethyl monophthalate as the component (b), and 30 parts of diethylene glycol dimethacrylate as the component (c) were compounded.

EXAMPLE 8

An ultraviolet-curable resin composition was obtained by following the procedure of Example 1, except that 10 parts of bis(methacryloyloxyethyl) phosphate as the component (a), 100 parts of acryloyloxyethyl monophthalate as the component (b), and 20 parts of diethylene glycol dimethacrylate as the component (c) were compounded.

EXAMPLE 9

An ultraviolet-curable resin composition was obtained by following the procedure of Example 1, except that 0.7 part of bis(methacryloyloxyethyl) phosphate as the component (a), 100 parts of acryloyloxyethyl monophthalate as the component (b), and 20 parts of diethylene glycol dimethacrylate as the component (c) were compounded.

EXAMPLE 10

An ultraviolet-curable resin composition was obtained by following the procedure of Example 1, except that 2 parts of bis(methacryloyloxyethyl) phosphate as the component (a), 100 parts of acryloyloxyethyl monophthalate as the component (b), and 15 parts of diethylene glycol dimethacrylate as the component (c) were compounded.

EXAMPLE 11

An ultraviolet-curable resin composition was obtained by following the procedure of Example 1, except that 2 parts of bis(methacryloyloxyethyl) phosphate as the component (a), 100 parts of acryloyloxyethyl monophthalate as the component (b), and 50 parts of diethylene glycol dimethacrylate as the component (c) were compounded.

COMPARATIVE EXAMPLE 1

An ultraviolet-curable resin composition was obtained by mixing and dissolving 5 parts of benzyl dimethyl ketal as the component (e) into a composition prepared by mixing 2 parts of bis(methacryloyloxyethyl) phosphate as the component (a), 100 parts of acryloyloxyethyl monophthalate as the component (b), 20 parts of diethylene glycol dimethacrylate as the component (c), and 0.2 part of fluorine-based surfactant (manufactured by Dainippon Ink and Chemicals Inc., Megafack F-177) as the component (d) while heating to 60° C.

COMPARATIVE EXAMPLE 2

An ultraviolet-curable resin composition was obtained by following the procedure of Comparative Example 1, except that 100 parts of acryloyloxypropyl monotetrahydrophthalate as the component (b) and 20 parts of ethylene oxide adduct of trimethylolpropane triacrylate (manufactured by Kyoeisha Kagaku K.K., Light Acrylate TMP-3EO-A) as the component (c) were compounded, without adding the component (a).

COMPARATIVE EXAMPLE 3

An ultraviolet-curable resin composition was obtained by mixing and dissolving 5 parts of benzyl dimethyl ketal as the component (e) into a composition prepared by mixing 100 parts of acryloyloxypropyl monotetrahydrophthalate as the component (b), 20 parts of ethylene oxide adduct of trimethylolpropane triacrylate (manufactured by Kyoeisha Kagaku K.K., Light Acrylate TMP-3EO-A) as the component (c), and 0.2 part of butadiene copolymer (manufactured by BYK Chemie Japan K.K., BYK-055) as the component (d) while heating to 60° C., without adding the component (a).

COMPARATIVE EXAMPLE 4

An ultraviolet-curable resin composition was obtained by mixing and dissolving 5 parts of benzyl dimethyl ketal as the component (e) into a composition prepared by mixing 2 parts of bis(methacryloyloxyethyl) phosphate as the component (a), 100 parts of acryloyloxyethyl monophthalate as the component (b), 50 parts of diethylene glycol dimethacrylate as the component (c), and 0.2 part of fluorine-based surfactant (manufactured by Dainippon Ink and Chemicals Inc., Megafack F-177) as the component (d) while heating to 60° C.

COMPARATIVE EXAMPLE 5

An ultraviolet-curable resin composition was obtained by mixing and dissolving 5 parts of benzyl dimethyl ketal as the component (e) into a composition prepared by mixing 15 parts of bis(methacryloyloxyethyl) phosphate as the component (a), 100 parts of acryloyloxyethyl monophthalate as the component (b), 20 parts of diethylene glycol dimethacrylate as the component (c), and 0.2 part of butadiene copolymer (manufactured by BYK Chemie Japan K.K., BYK-055) as the component (d) while heating to 60° C.

The compositions of Examples 1-11 and Comparative Examples 1-5 mentioned above are collectively shown in Table 1.

The ultraviolet-curable compositions obtained in Examples 1-11 and Comparative Examples 1-5 were each applied in a film thickness of 15 to 20 microns on a shadow mask which had undergone the primary etching by the use of a bar coater and then exposed to ultraviolet light by means of a high-pressure mercury vapor lamp of 80 kW/cm. The fact that the coating film of the composition has been cured was confirmed by the absence of tack on the surface of the coating film. When the properties of the cured coating film were evaluated, the results shown in Table 2 were obtained.

Further, the ultraviolet-curable composition of Example 5 was heated to 50° C., then applied on a shadow mask which had undergone the primary etching by the use of a bar coater and cured by means of a high-pressure mercury vapor lamp in the same manner as mentioned above. When the properties of this cured coating film were evaluated, the mark "Δ" in the column of the filling properties in Table 2 was shifted to "○". This means that the filling properties of the composition into minute concave portions have been improved.

TABLE 1

| Composition | Examples | | | | | | | | | | | Comparative Examples | | | | |
|---|---|---|---|---|---|---|---|---|---|---|---|---|---|---|---|---|
| | 1 | 2 | 3 | 4 | 5 | 6 | 7 | 8 | 9 | 10 | 11 | 1 | 2 | 3 | 4 | 5 |
| a | | | | | | | | | | | | | | | | |
| Bis (methacryloyloxy ethyl) phosphate | 2 | 2 | 2 | 2 | 2 | | | 10 | 0.7 | 2 | 2 | 2 | | | 2 | 15 |
| Methacryloyloxyethyl phosphate | | | | | | 2 | 2 | | | | | | | | | |
| b | | | | | | | | | | | | | | | | |
| Acryloyloxyethyl monophthalate | 100 | | | | 100 | 100 | 100 | 100 | 100 | 100 | 100 | 100 | | | 100 | 100 |
| Acryloyloxypropyl monotetrahydrophthalate | | 100 | | | | | | | | | | | 100 | 100 | | |
| Acryloyloxyethyl monohexahydrophthalate | | | 100 | | | | | | | | | | | | | |
| Acryloyloxyethyl monosuccinate | | | | 100 | | | | | | | | | | | | |
| c | | | | | | | | | | | | | | | | |
| 2-Hydroxyethyl methacrylate | | | | | | 15 | | | | | | | | | | |
| Diethylene glycol dimethacrylate | 20 | | | | | | 30 | 20 | 20 | 15 | 50 | 20 | | | 50 | 20 |
| 1,9-Nonanediol diacrylate | | 20 | | | | | | | | | | | | | | |
| Triethylene glycol diacrylate | | | 20 | | | | | | | | | | | | | |
| Light Acrylate TMP-3EO-A *1) | | | | 20 | | 15 | | | | | | | 20 | 20 | | |
| Polyethylene glycol diacrylate | | | | | 20 | | | | | | | | | | | |
| d | | | | | | | | | | | | | | | | |
| BYK-055 *2) | 0.2 | 0.2 | 0.2 | 0.2 | 0.2 | 0.2 | 0.2 | 0.2 | 0.2 | 0.2 | 0.2 | | | 0.2 | | 0.2 |
| Megafack F-177 *3) | | | | | | | | | | | | 0.2 | 0.2 | | 0.2 | |

TABLE 1-continued

|  | Examples | | | | | | | | | | | Comparative Examples | | | | |
|---|---|---|---|---|---|---|---|---|---|---|---|---|---|---|---|---|
| Composition | 1 | 2 | 3 | 4 | 5 | 6 | 7 | 8 | 9 | 10 | 11 | 1 | 2 | 3 | 4 | 5 |
| e |  |  |  |  |  |  |  |  |  |  |  |  |  |  |  |  |
| Benzyldimethyl ketal | 5 | 5 | 5 | 5 | 5 | 5 | 5 | 5 | 5 | 5 | 5 | 5 | 5 | 5 | 5 | 5 |
| Total | 127.2 | 127.2 | 127.2 | 127.2 | 127.2 | 137.2 | 137.2 | 135.2 | 125.7 | 122.2 | 157.2 | 127.2 | 125.2 | 125.2 | 157.2 | 140.2 |

*1):Light Acrylate TMP-3EO-A :manufactured by Kyoeisha Kagaku K.K, product name of ethylene oxide adduct of trimethylolpropane triacrylate
*2):BYK-055 :manufactured by BYK Chemie Japan K.K, product name of butadiene copolymer
*3):Megafack F-177 :manufactured by Dainippon Ink and Chemicals Inc., product name of flourine-based surfactant

TABLE 2

|  | Examples | | | | | | | | | | | Comparative Examples | | | | |
|---|---|---|---|---|---|---|---|---|---|---|---|---|---|---|---|---|
| Properties | 1 | 2 | 3 | 4 | 5 | 6 | 7 | 8 | 9 | 10 | 11 | 1 | 2 | 3 | 4 | 5 |
| Viscosity (cPs)/25° C. | 1198 | 614 | 512 | 123 | 9000 | 840 | 532 | 1178 | 1137 | 1772 | 184 | 1157 | 1587 | 1608 | 297 | 1600 |
| Viscosity (cPs)/50° C. | 236 | 164 | 143 | 51 | 584 | 246 | 164 | 317 | 317 | 461 | 82 | 348 | 461 | 440 | 108 | 184 |
| Surface tension (mN/m)/25° C. | 40 | 40 | 40 | 42 | 42 | 40 | 39 | 40 | 40 | 40 | 38 | 27 | 28 | 41 | 22 | 41 |
| Surface tension (mN/m)/50° C. | 39 | 39 | 39 | 40 | 41 | 40 | 36 | 38 | 39 | 38 | 36 | 25 | 25 | 39 | 20 | 38 |
| Contact angle (°)/25° C. | 11.1/ 20.7/ 14.4 | 10.6/ 18.0/ 11.1 | 13.0/ 23.5/ 16.5 | 8.0/ 8.4/ 5.0 | 7.6/ 18.0/ 14.4 | 11.9/ 21.5/ 15.0 | 11.0/ 20.5/ 16.0 | 11.5/ 21.0/ 14.0 | 12.0/ 20.5/ 13.5 | 11.5/ 20.0/ 14.0 | 10.0/ 20.1/ 14.0 | 27.0/ 34.0/ 30.5 | 26.0/ 34.0/ 31.0 | 11.5/ 20.0/ 14.5 | 31.2/ 34.0/ 33.8 | 10.0/ 18.5/ 10.5 |
| Contact angle (°)/50° C. | 8.3/ 17.8/ 12.1 | 7.0/ 16.0/ 8.5 | 11.2/ 20.8/ 14.5 | 7.5/ 8.0/ 10.0 | 6.9/ 18.1/ 12.1 | 10.0/ 18.6/ 12.9 | 10.5/ 19.0/ 14.5 | 11.0/ 19.5/ 13.0 | 11.0/ 19.5/ 13.0 | 10.5/ 18.5/ 13.0 | 9.5/ 18.0/ 10.2 | 25.1/ 28.0/ 27.6 | 25.0/ 27.7/ 28.1 | 10.5/ 18.0/ 14.0 | 30.0/ 31.8/ 32.0 | 10.0/ 18.0/ 9.5 |
| Filling property | ○ | ○ | ○ | ○ | Δ | ○ | ○ | ○ | ○ | ○ | ○ | X | X | ○ | X | ○ |
| Surface smoothness | ○ | ○ | ○ | ○ | ○ | ○ | ○ | ○ | ○ | ○ | ○ | X | X | ○ | X | ○ |
| Etching resistance | ○ | ○ | ○ | ○ | ○ | ○ | ○ | ○ | ○ | ○ | ○ | ○ | Δ | Δ | ○ | ○ |
| Alkali solubility and strippability | ○ | ○ | ○ | ○ | ○ | ○ | ○ | ○ | ○ | ○ | ○ | ○ | ○ | ○ | ○ | Δ |

Various characteristic values of the compositions of Examples 1-11 and Comparative Examples 1-5 mentioned above and their cured products were evaluated by the following methods.

Viscosity:

The viscosity of each composition at 25° C. and 50° C. was measured by using the E type viscometer.

Surface Tension:

The surface tension of each composition at 25° C. and 50° C. was measured by using the Dynometer (the Du-Nouy method).

Contact Angle:

First, the following three kinds of shadow mask substrates for evaluation were prepared. That is to say, three 5 cm square invar plate of 0.12 mm thickness prepared were degreased and washed by using an alkaline solution for the purpose of degreasing rolling oil, rustproof oil, etc. and rinsed with water. Thereafter, the photosensitive material consisting of casein and ammonium bichromate was applied on one surface thereof and dried to form a photosensitive layer. Then, two plates were exposed to ultraviolet light over the whole surface and then rinsed with water as a developing solution, dried, and baked. Then, these plates were immersed in a ferric chloride solution with a specific gravity of 1.500 and a liquid temperature of 70° C. for 15 minutes, rinsed with water, and dried with an air knife. One of two plates at this stage is specified as the 1st sample. Then, as to one other plate, the photosensitive layer was stripped in an aqueous 8% NaOH solution of a liquid temperature of 90° C., rinsed with water, and dried with the air knife. The resultant plate is specified as the 2nd sample. The remaining one plate having the photosensitive layer formed thereon was developed without exposure to light to remove the photosensitive layer, immersed in a ferric chloride solution (specific gravity: 1.500, liquid temperature: 70° C., free hydrochloric acid concentration: 0.2%) for 15 minutes, rinsed with water, and dried with the air knife. The resultant plate is specified as the 3rd sample. Each composition was dropped on these three shadow mask substrates and the contact angle was measured by using the contact angle meter, CA-X manufactured by Kyowa Kaimen Kagaku K.K.

Filling Properties:

Each ultraviolet-curable resin composition was applied on the shadow mask which has undergone the primary etching, and the filling property to the minute concave portions at that time was visually examined and rated.

○: Absence of air bubble
Δ: Presence of a few bubbles
×: Presence of bubbles

Surface Smoothness:

Each composition applied to a shadow mask was cured by ultraviolet-light irradiation, and then the surface state of the cured product was visually examined and rated.

◯: Absence of discernible defect

×: Occurrence of fish eyes or craters

Etching Resistance:

The shadow mask having the cured coating film formed from each composition was immersed in an aqueous 50% $FeCl_3$ solution (free hydrochloric acid concentration: 0.2%, liquid temperature: 75° C.) for 15 minutes, and the surface state of the cured coating film was visually examined and rated.

◯: Absence of discernible change

×: Occurrence of separation and discoloration

Alkali Solubility and Strippability:

The shadow mask having the cured coating film formed from each composition was immersed in an aqueous 8% NaOH solution (liquid temperature: 90° C.) for one minute, and the solubility and strippability of the cured coating film was visually examined and rated.

◯: Complete dissolution and stripping

×: Absence of dissolution and stripping

Since the ultraviolet-curable resin composition of the present invention can be applied on a finely undulating material surface without producing air bubbles and easily cured by ultraviolet-light irradiation for a short time, and the resultant resin film after curing has characteristics of exhibiting corrosion resistance to an acid treatment and solubility and strippability in an alkali treatment, it is useful as a protective material for etching, particularly a back-coating material of a shadow mask. Besides these usages, the ultraviolet-curable resin composition of the present invention can be used as a casting material, a paint, a molding material, etc. in various industrial fields.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and the range of equivalency of the claims are, therefore, intended to be embraced therein.

The disclosure in Japanese Patent Application No. 11-270358 of Sep. 24, 1999 is incorporated here by reference. This Japanese Patent Application describes the invention described hereinabove and claimed in the claims appended hereinbelow and provides the basis for a claim of priority for the instant invention under 35 U.S.C. 119.

What is claimed is:

1. An ultraviolet-curable resin composition comprising (a) a compound having one or more acryloyl or methacryloyl groups in its molecule and a phosphorus atom, (b) a compound having at least one carboxyl group and one acryloyl or methacryloyl group in its molecule, and (c) a compound having one or more acryloyl or methacryloyl groups in its molecule, wherein said compound (a) is incorporated therein in an amount of 0.5 to 10 parts by weight, based on 100 parts by weight of the total amount of said compounds (b) and (c), which exhibits the surface tension at 25° C. in the range of 30 to 50 mN/m.

2. The composition according to claim 1, further comprising (d) a leveling agent and (e) a photoinitiator.

3. The composition according to claim 2, wherein said leveling agent (d) is a butadiene copolymer.

4. A back-coating material to be used for the production of a shadow mask, comprising the ultraviolet-curable resin composition set forth in claim 1.

5. The back-coating material according to claim 4, which exhibits a contact angle of not more than 25° to a shadow mask substrate.

6. A method for the production of a shadow mask comprising at least a step of forming a photosensitive film on both sides of a shadow mask substrate consisting of a strip-like thin metal plate, a step of subjecting both sides having the photosensitive film formed thereon to exposure to light according to a predetermined pattern and to development, thereby exposing part of a metal surface according to the predetermined pattern to form an etching resist, a primary etching step for etching at least one surface of the thin metal plate having said etching resist formed thereon and the partially exposed metal surface, thereby forming concave portions in the exposed part of the metal surface of at least said one surface, a step of forming a back coat layer by applying a back-coating material on said one surface having the concave portions formed in said primary etching step and filling up said concave portions with the back-coating material, a secondary etching step for etching a surface opposite to said surface having the back coat layer formed thereon to form concave portions which communicate with the concave portions formed in the primary etching step, and a stripping step for removing the back coat layer and the etching resist, wherein the back-coating material set forth in claim 4 or 5 is used and cured by ultraviolet-light irradiation in said step of forming the back coat layer.

7. The method according to claim 6, wherein a method selected from the group consisting of a direct coating method, a gravure coating method, a microgravure coating method, a forced coating method, and a doctor nozzle coating method is used as the method for applying the back-coating material.

8. A shadow mask prepared by the method set forth in claim 6.

9. A shadow mask prepared by the method set forth in claim 7.

\* \* \* \* \*